Dec. 20, 1960 J. ROSENBAUM 2,965,819

HEAT DISSIPATING ELECTRONIC MOUNTING APPARATUS

Filed Aug. 7, 1958

INVENTOR
JACOB ROSENBAUM

United States Patent Office 2,965,819
Patented Dec. 20, 1960

2,965,819

HEAT DISSIPATING ELECTRONIC MOUNTING APPARATUS

Jacob Rosenbaum, 333 W. 52nd St., Spring Valley, N.Y.

Filed Aug. 7, 1958, Ser. No. 753,723

2 Claims. (Cl. 317—234)

The present invention relates to heat dissipating mounting means for electronic components, and particularly to mounting means constituting a heat sink for transistors, rectifiers and the like.

In the operation of transistors the temperature rise must be limited to a value specified by the manufacturer in order to enable the device to operate at or near its rated power capacity.

Considerable difficulty has been encountered in preventing temperature induced changes in the characteristics of transistors, particularly those having appreciable power ratings. A typical transistor having a collector dissipation of 11 watts, for example, at 80° C. or less requires a heat sink of 11 x 7 x 1/16 inches. The use of a multiplicity of such transistors in a given equipment would, it can be seen, require an inordinately large amount of sheet metal to dissipate the generated heat and keep the transistor at or below the rated temperature. The use of such large heat sinks is inconsistent with the high degree of size reduction of miniaturization demanded in modern electronic equipment.

An object of the present invention is to provide an effective compact heat sink which serves as a mounting means for electronic components, particularly transistors and which can be inexpensively and accurately fabricated, readily installed, and which permits easy secure mounting.

Another object of the invention is to provide heat-sinks for transistors, etc., which can be easily tailored to be compatible with different requirements of weight, space, and power to be dissipated.

According to the invention mounting means for transistors and the like are formed by utilizing one or more very conductive metallic channels having a large number of closely spaced parallel vanes or fins in the channel. The transistors are mounted on the channel so that good conduction between the transistor and the heat sink is obtained. Several channels may be juxtaposed with their open sides toward each other or with the vanes interleaved. The channel or channels are arranged to provide a chimney effect, so that convection currents are produced by the heat itself. Due to the closeness or density of the fins the air therebetween is heated sufficiently to give it velocity, producing cooling thereby.

The invention will be fully understood and other objects and advantages thereof will be apparent from the following description and the accompanying drawing in which.

Figures 1, 2, 3, 4, 5:
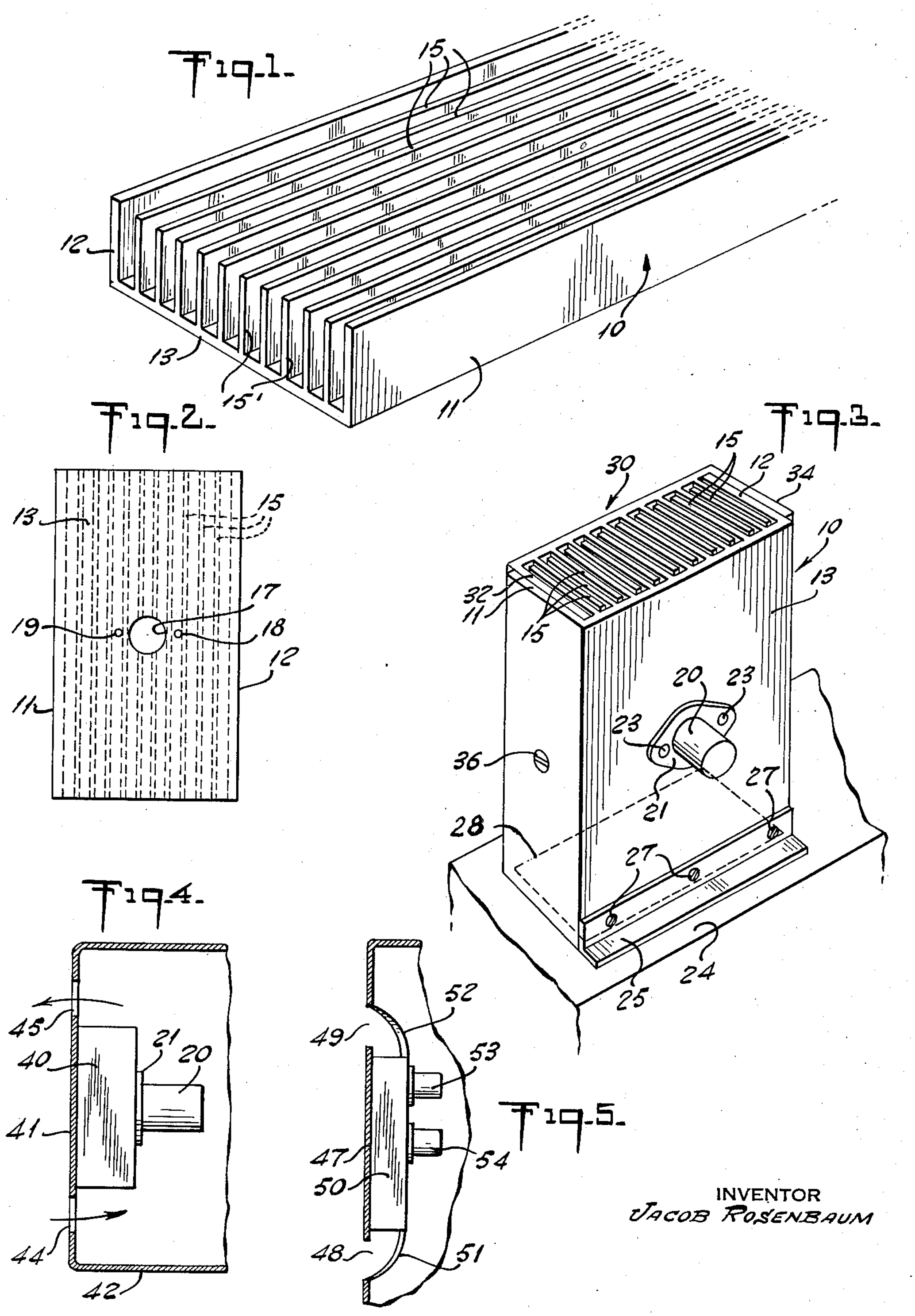
Fig. 1 is an isometric view of a mounting unit according to the invention.
Fig. 2 is a front view of the mounting unit.
Fig. 3 is an isometric view of an interleaved form of mounting device.
Fig. 4 is a partial view of a mounting unit fastened to a casing.
Fig. 5 is an isometric view of a mounting device located on a wall of a casing.

Referring to the drawing, the mounting unit 10 consists of a U-shaped channel having sides 11 and 12 and a base 13. A plurality of closely-spaced parallel fins 15 extend from the base 13. Very long channels of this type may be provided and units of a desired length cut therefrom. The unit 10 is formed, preferably, of copper or aluminum by extrusion or other processes producing a homogeneous unit to provide an inexpensive, rigid, light-weight, highly conductive unit, but it will be understood that other metals such as silver or other good thermal conductors may be used. The unit may be treated to give it a dull black finish or coating to increase its heat dissipation; thus the unit suitably may be anodized. Unit 10 may be formed in various sizes. The fins are, of course, integral with the channel 11–13.

In order to mount an electronic element on the unit, a hole 17 is preferably drilled in the plate 13 in a manner to clear the fins. Hole 17 may extend throughout the entire width of the fins. Additional mounting holes 18 and 19 may be drilled. A transistor or other element 20 may be mounted on the unit in any suitable way. The transistor or other element 20 may be fastened either conductively or insulatingly to the unit 10 by screws, rivets or equivalent means 23, over the hole 17 so as to provide a maximum transfer of heat from the transistor to heat sink 10. The wiring of the transistor may be completed before it is fastened in place, particularly if it has terminals on its under side. If the terminals are not on the under side of the transistor, it may be wired into the circuit after it is mounted on the cooling unit 10.

The mounting unit 10 may be fixed to a chassis 24 by any suitable means such as brazing its bottom end to the chassis, or by screws or rivets, or by small angle-brackets at the corners of the mounting unit and the chassis, on which the brackets may be held by screws. The mounting unit may also be formed with an integral flange 25 fastened to the chassis 24 by screws or other means 27. The chassis is preferably provided with a hole 28 to permit circulation through the mounting unit.

As shown in Fig. 3 unit 10 may be combined with a second like unit 30 so that their fins 15 interleave. The ends 32 and 34 of unit 30 are preferably in abutment with ends 11 and 12 of unit 10. Units 10 and 30 are fastened together by any suitable means, such as screws 36. The dual unit 10, 30 may have transistors mounted on several sides thereof. The very high fin density of the dual unit makes it an effective heat sink with a large mounting area for electronic components.

Fig. 4 illustrates the mounting of a heat sink 40 which may be of the single or dual type, mounted by any suitable means on the wall 41 of an electronic equipment casing 42. Openings 44 and 45 may be provided above and below unit 40 so that access to air outside the cabinet 42 can be used to increase the amount of heat dissipated. One or more transistors 46 are mounted on the wall of unit 40. Air enters the lower opening 44, passes through the chimney formed by unit 40 and then escapes through opening 45.

Fig. 5 illustrates a modification of the apparatus shown in Fig. 4. The casing 47 is provided with any suitable type of openings, slots or louvers 48 and 49 located below and above a heat sink unit 50, which is preferably of the dual type. The air is guided between openings 48 and 49 and unit 50 by baffles 51 and 52. Transistors 53, 54 are mounted on unit 50. The openings 48 and 49 may be formed in any suitable way and protectively covered if desired, as is known in the electronic art.

It will be apparent that I have illustrated only a few examples of the possible use of heat sinks formed according to the invention and that variations and modifications of the heat sinks and the applications thereof will readily occur to those skilled in the art. The invention, therefore, is not to be construed as limited except as defined in the following claims.

What is claimed is:

1. Mounting and heat removal apparatus for electronic components, comprising an elongated unitary metallic U-shaped channel having a metallic base and a pair of metallic side walls forming the two opposite sides of the channel and extending in the direction of the length of the channel, a plurality of metallic vanes extending parallel to the sides, said vanes being integral with the base and forming substantially unobstructed air passages therealong, and means for mounting the channel vertically with the upper and lower ends thereof open and means for closing the side of the channel opposite the base, means for providing an air inlet at the bottom of said channel and an air outlet at the top of said channel so that air flows through said passages vertically when the channel is heated by an electronic component mounted thereon, said means for closing the side opposite the base including a second metallic U-shaped channel of substantially the same dimensions as the first-mentioned channel and having vanes arranged similarly to the vanes of the first channel and interleaved therewith, a transistor, and means for mounting said transistor on said base.

2. Apparatus according to claim 1, in which the base and the vanes have an opening adapted to receive said transistor.

References Cited in the file of this patent

UNITED STATES PATENTS

| | | |
|---|---|---|
| 2,179,137 | Stevens et al. | Nov. 7, 1939 |
| 2,730,663 | Harty | Jan. 10, 1956 |